United States Patent [19]

Roche

[11] 4,311,533
[45] Jan. 19, 1982

[54] METHOD OF MAKING SELF-ALIGNED DIFFERENTLY DOPED REGIONS BY CONTROLLED THERMAL FLOW OF PHOTORESIST LAYER

[75] Inventor: Marcel Roche, Paris, France

[73] Assignee: Thomson-CSF, Paris, France

[21] Appl. No.: 161,572

[22] Filed: Jun. 20, 1980

[30] Foreign Application Priority Data

Jun. 22, 1979 [FR] France ................................ 79 16055

[51] Int. Cl.³ ...................... H01L 21/26; B05D 3/04; B05D 3/12
[52] U.S. Cl. .................................... 148/1.5; 148/187; 156/644; 156/660; 427/43.1
[58] Field of Search ................ 148/1.5, 187; 427/43.1; 156/644, 660

[56] References Cited

U.S. PATENT DOCUMENTS

| | | | |
|---|---|---|---|
| 3,920,483 | 11/1975 | Johnson, Jr. et al. | 148/1.5 |
| 3,951,694 | 4/1976 | Manfret | 148/1.5 |
| 3,976,524 | 8/1976 | Feng | 156/8 |
| 4,022,932 | 5/1977 | Feng | 427/93 |
| 4,084,987 | 4/1978 | Godber | 148/1.5 |
| 4,201,800 | 5/1980 | Alcorn et al. | 148/187 |
| 4,204,894 | 5/1980 | Komeda et al. | 148/188 |
| 4,253,888 | 3/1981 | Kikuchi | 148/187 |

FOREIGN PATENT DOCUMENTS

| | | |
|---|---|---|
| 3733 | 9/1979 | European Pat. Off. . |
| 2018027 | 10/1970 | Fed. Rep. of Germany . |
| 1437781 | 3/1966 | France . |
| 2305022 | 10/1976 | France . |

OTHER PUBLICATIONS

IBM-Tech. Disclosure Bulletin, 14 (1972), p. 2607.
Abbas et al., IBM-TDB, 20 (1977), 1376.

Primary Examiner—Upendra Roy
Attorney, Agent, or Firm—Cushman, Darby & Cushman

[57] ABSTRACT

A method for the self alignment of differently doped regions in a silicon substrate. According to this method one uses the controlled thermal flow of a resin for defining successive stepped doping zones. This applies for example to the formation of emitters and bases for transistors of an integrated circuit.

7 Claims, 17 Drawing Figures

METHOD OF MAKING SELF-ALIGNED DIFFERENTLY DOPED REGIONS BY CONTROLLED THERMAL FLOW OF PHOTORESIST LAYER

BACKGROUND OF THE INVENTION

The present invention relates to a process of self-alignment of differently doped regions, particularly the regions of the emitters and of the base contacts, in particular for the manufacture of transistors and integrated circuits.

In the field of production of semiconductor devices having high performances, concerning for example the switching time, the frequency gain, the signal/noise ratio, etc., all the parasite elements must be reduced, which involves in general a greater and greater miniaturization of all or part of the dimensions. Independently of the performances, this miniaturization is desirable for increasing the integration density in the case of integrated circuits. Insofar as the depth is concerned, reduction in this direction is conditioned by the mastery of the distribution profiles of the doping impurities, which is acquired for example by means of ionic implantation. But, insofar as the surface extent is concerned, an important limiting factor is the accuracy which may be expected in the relative positioning of the apertures provided in the basic structure and serving to define the different regions to be doped, i.e. the regions of the emitters and the base contacts.

In the prior art, it is known to use for this purpose a so-called "self-aligning" technique, in which relative positioning is achieved of two apertures and of regions with different doping obtained from these apertures and this so that the apertures or the regions do not overlap, while being situated at a relative distance as reduced as possible. There will be described hereafter, with reference to FIGS. 1 to 11 accompanying the present application, two known examples of implementing this technique in the case of the manufacture of an ultra-high frequency transistor, of the type formed with a conventional interdigitated structure, in which the emitter of the transistor is formed by fingers alternating with base contacts.

In a conventional technique (FIG. 1), there is deposited on a substrate 1, for example of type n+, an epitaxial layer of the same type (n) 2. After depositing a masking layer, for example an oxide layer 3, apertures are provided by photo-etching, through which p-type impurities are introduced so as to create weakly resistive zones 4, which are intended to receive subsequently a contact metal. Then another aperture 5 is formed in the masking oxide layer and base 6 is formed by ionic implantation or by diffusion. Then a new, for example oxide, masking layer 7 is deposited on base 6. Then the emitter regions 8 are formed by the known technique of photo-etching, the emitters then being obtained by diffusion or implantation of impurities, of type n in the case considered. The end of the procedure, relative to the photo-etching of the contact zones, to the metal deposit and to the photo-etching of the interconnections, is then carried out in a known way and is therefore not shown in the figure.

With the procedure outlined above, the distance which may be obtained between the emitters cannot be much less than 3 microns without using the self-aligning technique, which enabled this figure to be lowered in a reproducible way to 1 micron or to a few tenths of a micron, so the factor of merit of the device to be improved, which depends among other things intimately on this distance.

According to a first process known under the name of composite masking, this distance may be reduced to 2 microns in a reproducible way, by inscribing all the apertures, corresponding to the different regions to be doped, in a "memory" mask and by successively selecting each of the apertures by means of a selection mask. The sequence of the operations is reproduced in the accompanying FIGS. 2 to 5. On a substrate 9 of type n+ for example there is deposited an epitaxial layer 10 of the same type and, after formation of a masking layer, for example an oxide layer 11, an aperture is formed whose edges are shown at 12 and at the level of which base 13 is formed by diffusion or implantation of ions. Then a masking layer 14, for example an oxide layer, is deposited to give the structure of FIG. 2. Then, by means of a composite mask 15 (FIG. 3) having apertures 16 for forming the emitters and apertures 17 for forming the base contacts, i.e. comprising the two types of regions to be self-aligned, etching is carried out by conventional photo-lithography over about half of the thickness of layer 14, at the level of apertures 16 and 17. Then (FIG. 4) by using a mask 18 for selection of the base contacts, whose apertures 19 are greater than their counterparts 17 in the composite mask 15, by a distance equal to the maximum possible positioning error attributable to the machines and/or to the operator, the regions of the base contacts are opened, which gives the structure shown in FIG. 5, in which diffusion is then carried out, at the level of the apertures, in regions 20, after removal of mask 18. The photo-etching of the emitters is carried out according to the same principle by means of a mask 21 for selecting emitters 4 (FIG. 6), whose apertures are greater than the corresponding ones in the composite mask, by a distance again equal to the maximum possible positioning error, then diffusion of the emitter(s) 22 is effected, after removal of mask 21.

According to another known self-aligning process described in U.S. Pat. No. 3,951,693, it is possible to reduce the distance between the regions to be doped to a few tenths of a micron. The sequence of operations, illustrated in FIGS. 7 to 11 accompanying the present application, is the following. The formation of the epitaxial layer 23 on a substrate 24, the formation of the masking layer 25, the photo-etching and the diffusion of base 26 are effected conventionally as already indicated in the preceding example. Then a layer of silicon nitride 27 and a silica layer 28 are deposited which are then photo-etched with the same mask, not shown, comprising the patterns of the emitters, and the emitter(s) 29 is implanted after removal of the mask in accordance with FIG. 8. The nitride 27 protected by the silica layer 28 situated above is etched laterally as indicated in FIG. 9 (arrows 30). Then the silica layer 28 is eliminated and another silica layer 31 (FIG. 10) is formed, by an appropriate heat treatment, on the silicon zones not covered by the nitride layer 27. After elimination of this latter, the heavily doped regions 32 of type p+ (FIG. 11) are formed by doping, which are thus self-positioned with respect to emitters 29, the distance or the spacing shown at d in the figure designating the spacing apart of the differently doped regions 29 and 32 and being of the order of a few tenths of a micron with this technique.

But, the quality of the self-aligning depends on the lateral etching of the nitride. Now, the reproducibility of this latter is difficult to master for it is intimately connected with the silica layer 28, which is itself conditioned by numerous parameters which may vary, such for example as cleaning before depositing the silica and nitride layers, the conditions for depositing, the quality of the interfaces, etc.

With the first process which may be implemented in a reproducible way, the distance between the regions to be self-aligned can only be reduced to about 2 microns, whereas the second process enables this distance to be reduced to a few tenths of a micron, but in a way which is not reproducible.

The present invention has then as its aim to provide a process for self-aligning differently doped regions, which allows self-aligning of said regions to be obtained within a few tenths of a micron.

SUMMARY OF THE INVENTION

This process for self-aligning differently doped regions, particularly emitter and base contact regions, in particular for the manufacture of transistors and integrated circuits, is characterized by the fact that it consists in using the controlled flow of a photosensitive resin.

An advantage of this method is that it does not depend on between-layer adhesion conditions. The principle used consists in etching, in a silicon nitride layer deposited on the silicon, the preserved zones corresponding to one of the regions to be doped, for example the emitter, then—without removing the photosensitive resin having served for the photo-etching—in causing this resin to flow by means of an appropriate heat treatment to obtain even widening of the resin mask about the nitride elements, the non-covered regions defining the second region, for example that corresponding to the extrinsic base p+, situated about the emitter. This latter is formed by means of a triple implantation of boron ions. After removal of the masking resin, the emitter zones are then freed by oxidizing the uncovered silicon and the nitride elements are then eliminated. The emitter may then be formed by diffusion or implantation.

The above and other objects, features and advantages of the present invention will become apparent from the following description, given solely by way of non-limiting illustration, when taken in conjunction with the accompanying drawings.

DESCRIPTION OF THE PREFERRED EMBODIMENT

There will now be described with reference to FIGS. 12 to 17 the non-limiting application of the process of the invention to an ultra-high frequency NPN transistor. The numerical values indicated are given solely by way of indication.

Figure 1:
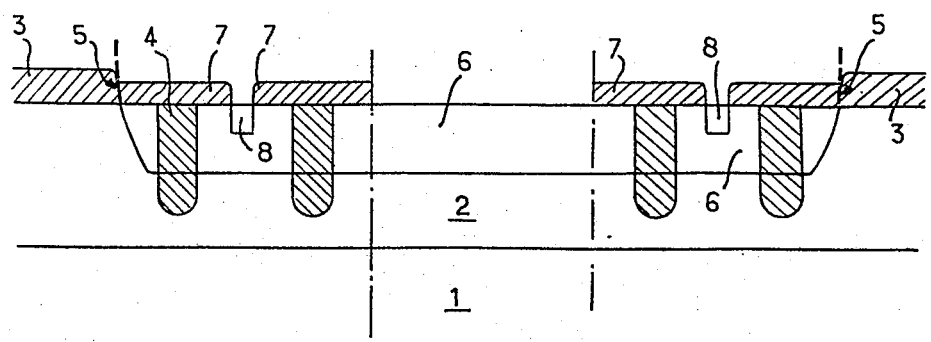
FIGS. 1 to 11, which have already been mentioned, concern two self-aligning techniques known in the prior art.
Figure 2:
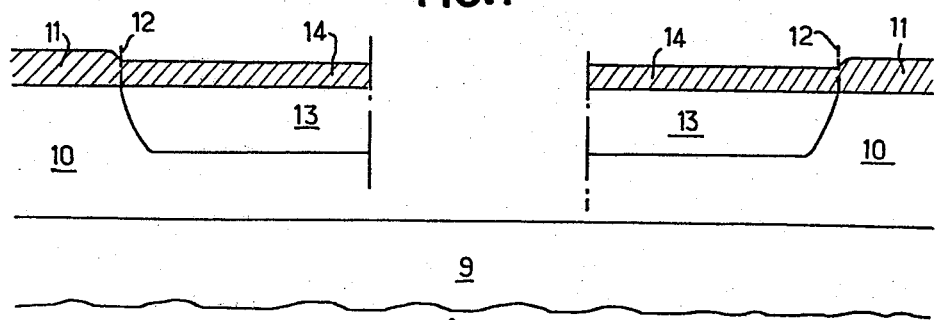
Figure 3:
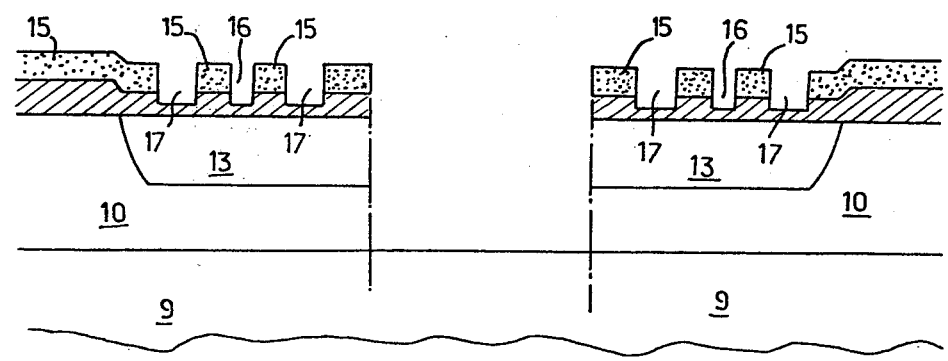
Figure 4:
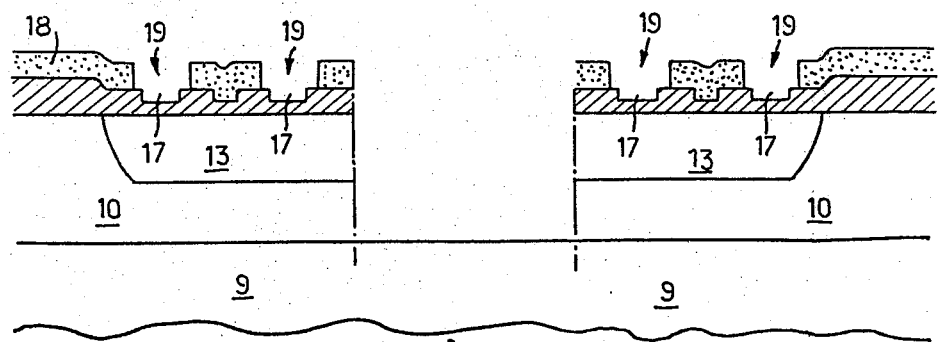
Figure 5:
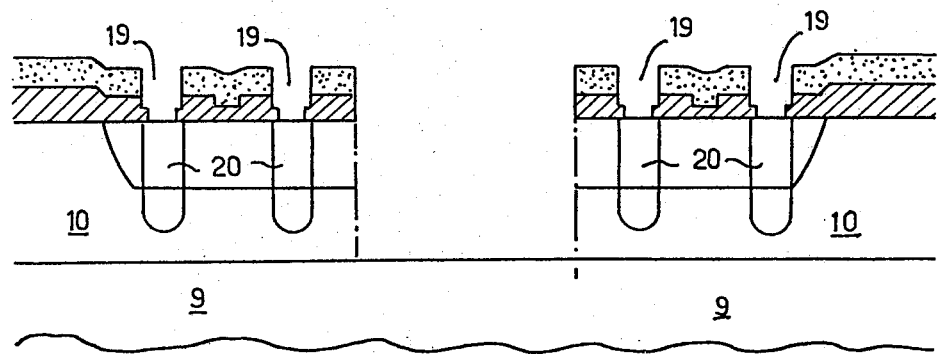
Figure 6:
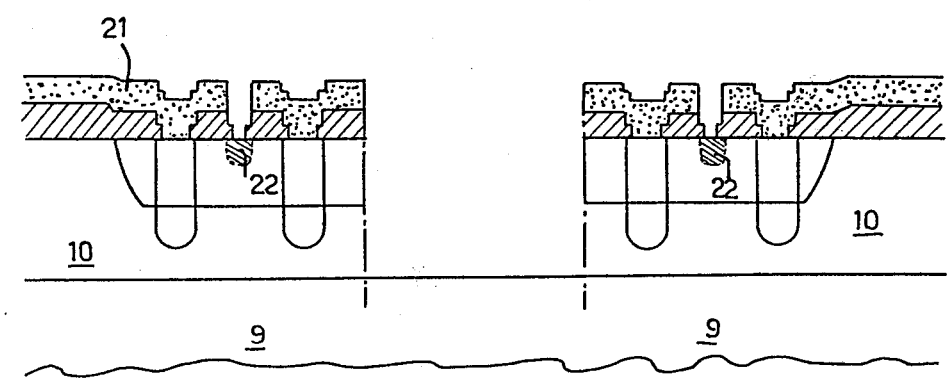
Figure 7:
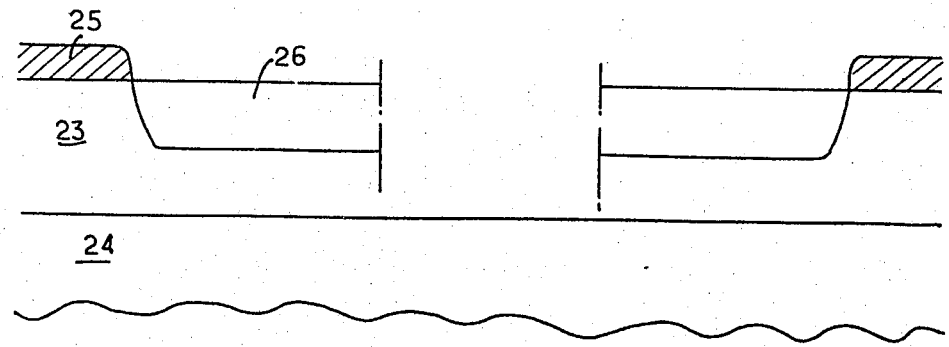
Figure 8:
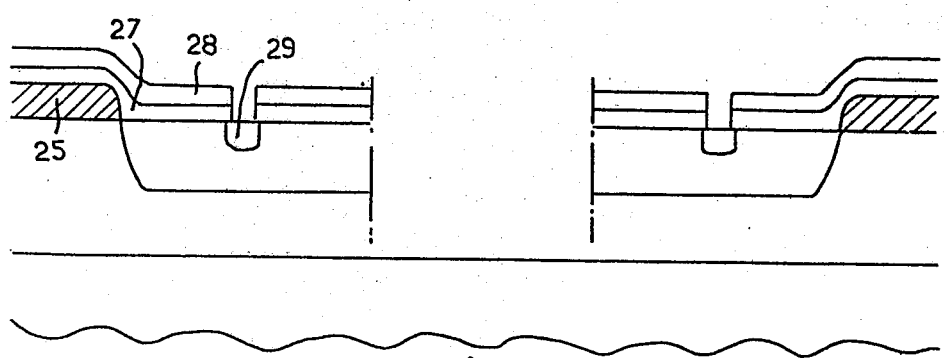
Figure 9:
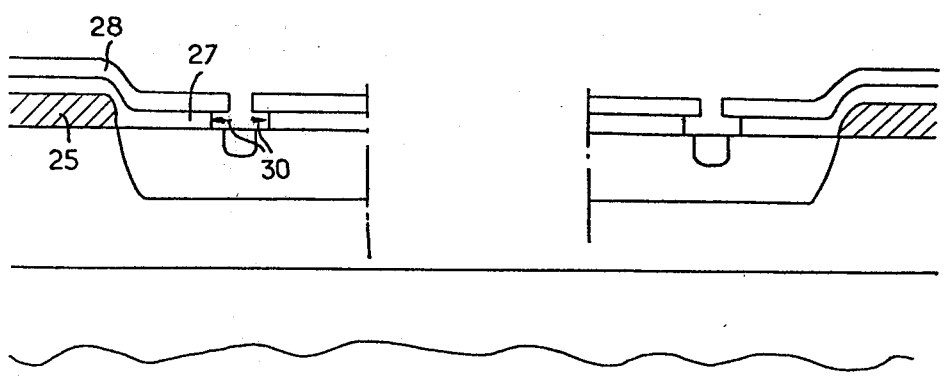
Figure 10:
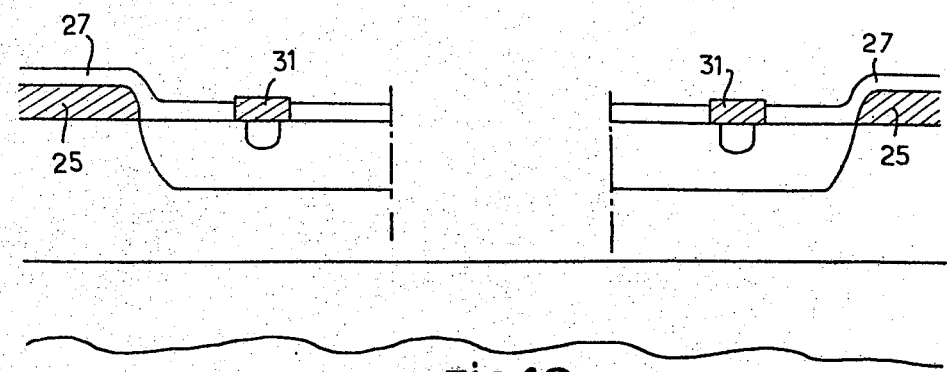
Figure 11:
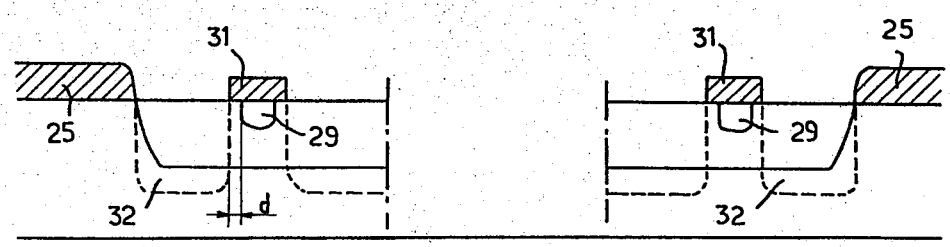
Figure 12:
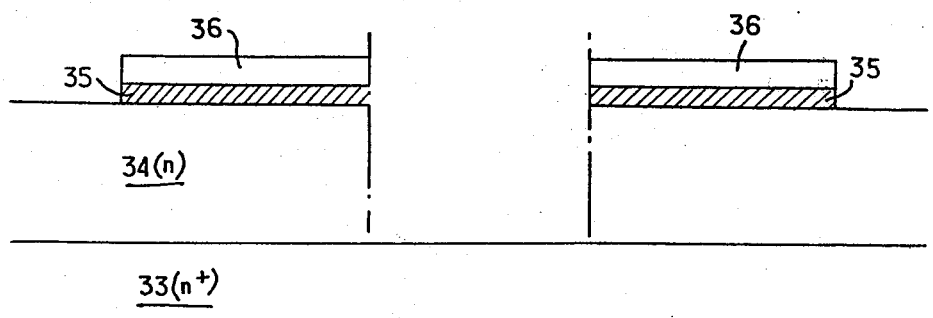
FIGS. 12 to 17 illustrate the different phases for implementing the process of the invention.

On a substrate 33 of type n+, whose resistivity is for example of the order of 1/100th $\Omega$. cm, a n-type epitaxial layer 34 is formed, having a thickness from 2 to 4 microns and a resistivity between 0.7 and 2 $\Omega$. cm (see FIG. 12). On this layer is formed, by heat treatment in an oxidizing atmosphere at a temperature between 950° C. and 1100° C., a silica layer 35, whose thickness is of the order of 500 Å and the essential purpose of which is to reduce the mechanical stresses, sources of crystalline defects, produced during heat treatment by the presence of a silicon nitride layer deposited on the silicon. The silicon nitride layer 36 of a thickness of about 1000 Å is deposited and a new oxidizing heat treatment transforms the upper part of the nitride layer (a few tens of angstroems) into silica, which will allow subsequent perfectly defined photo-etching to be effected. Then photo-etching of different layers of dielectric (silica, nitride, silica) is carried out to preserve the layers on the basic structure shown in FIG. 12. Preferably, during photo-etching, the silica and the nitride are dissolved respectively in an FH-FNH$_4$ solution and a freon plasma.

Figure 13:
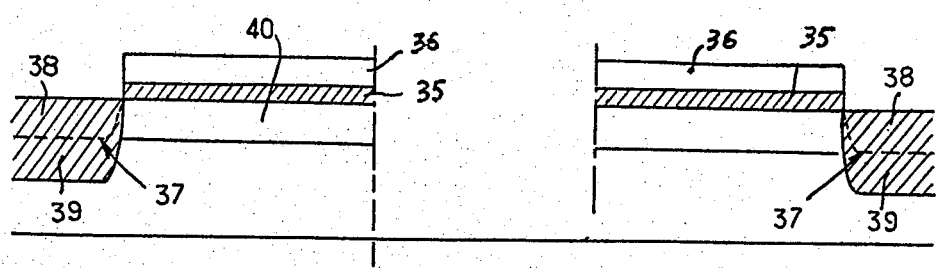
Figure 14:
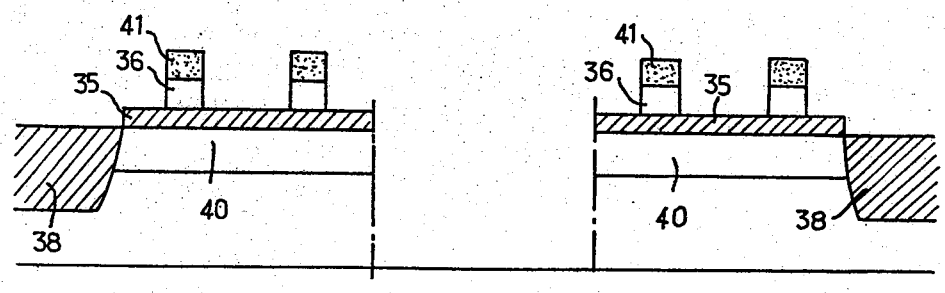

As indicated by a dotted line 37 in FIG. 13, an upper silicon layer 38 of a thickness of the order of 0.6 micron is then removed by dissolution in an FH and HNO$_3$ based solution. The bared silicon is then oxidized to create an oxide layer 39 whose thickness is double that of the recess 38 which guarantees the substantial flatness of the surface and so the reliability of the interconnection network, for the greater part of this latter is then further away from the collector because of the great oxide thickness, which reduces the parasite capacities. Then base 40 is implanted through layers 35 and 36 using for example boron ions with a dose between $4 \times 10^{13}$ At/cm$^2$ and $1.5 \times 10^{14}$ At/cm$^2$ and an energy between 70 kev and 150 kev. Then photo-etching of the oxidized nitride layer 36 is carried out by using a photosensitive resin 41 so as to preserve the nitride at the level of the regions of the emitters. One then obtains the structure shown in FIG. 14.

Figure 15:
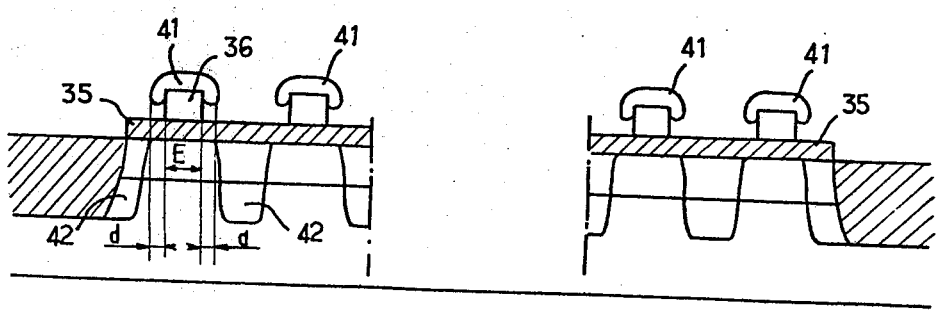

Then, in accordance with FIG. 15, while preserving the parts of photosensitive resin 41, the whole is subjected to heat treatment for a period between 20 minutes and 2 hours and preferably equal to 60 minutes and at a temperature between 125° C. and 170° C. and preferably equal to 150° C. (for a resin of the AZ111 type manufactured by the firm Shipley) to initiate a beginning of flow. This flow continues normally during implantation, then effected and serving to form the extrinsic p+ base zone 42. As can be seen in FIG. 15, there is thus obtained between zones E which correspond to the emitters properly speaking, formed subsequently, and the lateral regions of the structure, a region of uniform width d of only a few tenths of a micron, taking into account the thickness of the resins usually used. This width d may be varied by heat treatment by using a greater or lesser quantity of heat. Then, and during the heat treatment for obtaining flow of the resin, the above-mentioned extrinsic base zone 42 is formed by ionic implantation so as to obtain an optimized profile producing only small parasite resistances. This implantation is effected through silica layer 35 by using preferably boron ions and is threefold with dose/energy values given by indication in the order of execution: $3 \times 10^{15}$ At/cm$^2$/80 kev, $10^{15}$ At/cm$^2$/50 kev and $3 \times 10^{14}$ At/cm$^2$/25 kev. This threefold implantation provides a doping profile whose variation depends on the distance to the periphery of the emitter and ensures the best low resistance/high injection efficiency compromise.

Figure 16:
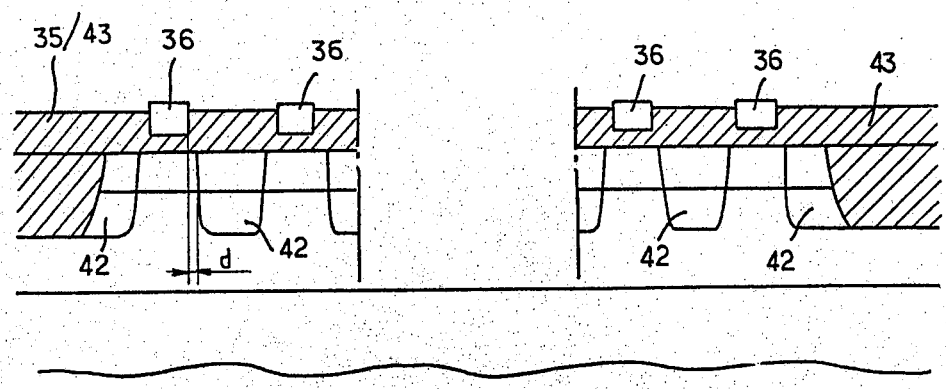
Figure 17:
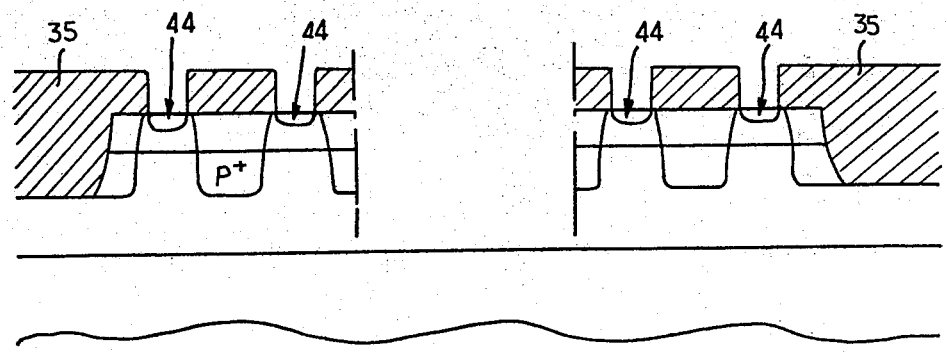

Then the masking resin 41 is dissolved in an oxygen plasma and the silica layer 35 is increased to obtain a final silica layer 43, in the regions not covered by the nitride 36, by means of an oxidizing treatment also serving to restore the silicon and the structure of FIG. 16 is obtained. It will be noted that this oxidizing treatment results also in a slight lateral oxidation of the silicon under the nitride elements or islands 36 and so there occurs a slight consumption of the silicon situated below the nitride islands and, consequently, a slight narrowing of the width of the regions of the emitter(s), and therefore a slight increase of d, which must be taken into account during the previous flow. By way of example, the total thickness of the silica layer 43 is of the order of 2000 Å. After elimination of the nitride islands 36 by dissolution in a solution of boiling orthophosphoric acid, as well as the underlying silica layer by partial deoxidization, emitters 44 are formed by implantation of arsenic ions for example, with a dose between $3 \times 10^{15}$ At/cm$^2$ and $6 \times 10^{15}$ At/cm$^2$ and an energy of the order of 80 kev (see FIG. 17). A new heat treatment between 920° C. and 970° C. ensures the regeneration of the silicon. The emitter(s) are thus self-positioned with respect to the extrinsic base p$^{30}$ regions 42, within a distance of a few tenths of a micron. Then photo-etching of the base contacts is carried out in the p+ regions 42 and finally the interconnection network is formed by one of the well-known conventional techniques.

It will be noted that the self-alignment thus obtained of the emitters with respect to the extrinsic base regions is furthermore variable by adjusting the heat used for the flow operation and the duration thereof.

It is apparent that within the scope of the invention, modifications and different arrangements can be made other than are here disclosed. The present disclosure is merely illustrative with the invention comprehending all variations thereof.

What is claimed is:

1. A process for the self-alignment of differently doped regions in a silicon substrate, comprising the steps of:
   (a) coating this substrate with successive layers of thin silica, silicon nitride and photosensitive resin,
   (b) opening in a corresponding way windows in the resin and nitride layers, while maintaining nitride regions covered with resin,
   (c) causing the resin to flow in a controlled way with overflowing with respect to the nitride regions to define a first implantation mask,
   (d) implanting a first dopant,
   (e) removing by selective etching the resin layer,
   (f) increasing the thickness of the thin oxide layer at the positions not covered with nitride,
   (g) removing by selective etching the nitride regions,
   (h) using the second mask defined by the differences of thickness of the remaining oxide layer to implant a second dopant.

2. The process as claimed in claim 1 for the selfalignment of emitter and base regions for the manufacture of high-frequency transistors, wherein the first implantation mask serves for implanting base contact regions, and the second mask for implanting the emitter zones.

3. The process as claimed in claim 1 comprising after step g, the step consisting in the limited etching of the oxide layer to bare the silicon substrate at positions corresponding to those previously occupied by the nitride regions.

4. The process as claimed in claim 1, wherein the flow of the resin is achieved under the effect of heat treatment and then conjointly under the effect of ion bombardment during ionic implantation.

5. The process as claimed in claim 4, wherein the heat treatment is effected between 125° C. and 170° C. and preferably at 150° C. for a period of time between 20 minutes and 2 hours, and preferably for 60 minutes.

6. The process as claimed in one of claims 4 or 5, wherein the ionic implantation is a threefold implantation of boron ions with consecutive dose/energy couples having for values $3 \times 10^{15}$ At/cm$^2$—80 kev, $10^{15}$ At/cm$^2$—50 kev, $3 \times 10^{14}$ At/cm$^2$—25 kev.

7. The process as claimed in claim 3, wherein the self-aligning spacing of the differently doped regions is adjusted by modifying the characteristics of the flow heat treatment.

* * * * *